(12) United States Patent
Ayai et al.

(10) Patent No.: US 6,828,508 B1
(45) Date of Patent: Dec. 7, 2004

(54) OXIDE HIGH-TEMPERATURE SUPERCONDUCTOR WIRE AND METHOD OF PRODUCING THE SAME

(75) Inventors: Naoki Ayai, Osaka (JP); Munetsugu Ueyama, Kanuma (JP); Kazuhiko Hayashi, Osaka (JP); Hiroshi Maeda, Komuinshukusha 11-22, 111-2, Toryo-chi, Kitami-shi, Hokkaido (JP); Mitsunori Sato, Kitami (JP)

(73) Assignees: Sumitomo Electric Industries, Ltd., Osaka (JP); Hiroshi Maeda, Hokkaido (JP)

( * ) Notice: Subject to any disclaimer, the term of this patent is extended or adjusted under 35 U.S.C. 154(b) by 202 days.

(21) Appl. No.: 09/869,376

(22) PCT Filed: Oct. 30, 2000

(86) PCT No.: PCT/JP00/07649

§ 371 (c)(1),
(2), (4) Date: Jun. 28, 2001

(87) PCT Pub. No.: WO01/35423

PCT Pub. Date: May 17, 2001

(30) Foreign Application Priority Data

Nov. 8, 1999 (JP) .......................................... 11-317021

(51) Int. Cl.[7] .............................................. H01B 12/00
(52) U.S. Cl. ...................... 174/125.1; 29/599; 505/230; 505/231; 505/434
(58) Field of Search ........................ 174/125.1; 29/599; 505/230, 231, 433, 431, 434, 430, 121

(56) References Cited

U.S. PATENT DOCUMENTS 6,344,287 B1 * 2/2002 Celik et al. ................. 428/697
6,397,454 B1 * 6/2002 Seuntjens et al. ............. 29/599

FOREIGN PATENT DOCUMENTS

| EP | 0964458 A1 | 12/1999 |
| JP | 3-15116 | 1/1991 |
| JP | 6-76650 | 3/1994 |
| JP | 7-169342 | 7/1995 |
| JP | 407201231 A * | 8/1995 |
| JP | 10-50152 | 2/1998 |
| JP | 10-247428 | 9/1998 |
| JP | 411273469 A * | 10/1999 |
| JP | 11-312420 | 11/1999 |
| WO | 96/28853 | 9/1996 |

* cited by examiner

*Primary Examiner*—Evan Pert
*Assistant Examiner*—J B Patel
(74) *Attorney, Agent, or Firm*—Foley & Lardner LLP (57) ABSTRACT

A high temperature oxide superconducting wire is provided which is capable of preventing metal located on the outer periphery of the superconducting wire from diffusing into a superconductor to achieve restriction of reduction in the critical current density. The high temperature oxide superconducting wire includes a high temperature oxide superconductor 1, a sheathing body 2 formed of material containing silver for coating the high temperature oxide superconductor 1, a heat-resistant oxide ceramic material 3 for coating the sheathing body 2, and a coating body 4 which is inactive relative to the heat-resistant oxide ceramic material 3 in a high temperature oxidative atmosphere.

35 Claims, 4 Drawing Sheets

OXIDE HIGH-TEMPERATURE SUPERCONDUCTOR WIRE AND METHOD OF PRODUCING THE SAME

TECHNICAL FIELD

The present invention relates generally to oxide high-temperature conducting wires and methods of producing the same and in particular to oxide high-temperature superconducting wires for use in the fields of electric power, transportation, high energy, medical field and the like and methods of producing the same.

BACKGROUND ART

In recent years it has been reported that an oxide sintered compact exhibits superconducting properties at high critical temperature, and such superconducting properties are being employed to promote practical use of superconduction technology. It has been reported that a yttrium-based oxide presents superconduction at a temperature of 90k and a bismuth-based oxide at a temperature of 110k. These oxide superconductors are expected to serve practical use as they exhibit superconducting properties in liquid nitrogen, which is available at relatively low cost.

To allow such a superconductor to pass ac current to supply power, the superconductor is sheathed with silver, the silver sheath is coated with a high-resistance element and the high-resistance element is also coated with metal to provide a superconducting wire to pass ac current.

The superconductor is sheathed with silver in order to prevent the superconductor from having a crystal structure impaired when it is for example drawn. The silver sheath is coated with the high-resistance element in order to reduce ac loss. Furthermore, the high-resistance element is coated with metal in order to obtain a level of elasticity required for the superconducting wire.

To allow such a superconducting wire as described above to serve practical use, its critical current value needs to be improved. In particular, to use the superconducting wire for a cable, ac equipment for example for a transformer and the like, not only is its critical current value required to be improved but also its ac loss must be reduced. To achieve this, the silver sheath is covered with a high-resistance element formed of a material carefully selected.

Such a superconducting wire structured as above is disclosed for example in International Publication WO96-28853 and Japanese Patent Laying-Open No. 10-50152.

International Publication WO96-28853 discloses a method of producing an oxide high-temperature superconducting wire, wherein an oxide superconductor is circumferentially coated for example with silver and thereon further circumferentially coated with a metal which is in turn oxidized to form a high-resistance element formed of a metal oxide between the silver and the metal.

Japanese Patent Laying-Open No. 10-50152 discloses a method of producing an oxide high-temperature superconducting wire, wherein an oxide superconductor is coated with silver and then thereon circumferentially coated with a resistive alloy (a high-resistance element) which is in turn oxidized to provide an insulating oxide between the silver and the resistive alloy.

In the techniques disclosed in the above two documents, however, a metal or a resistive alloy is oxidized to provide a high-resistance element or an insulating oxide. In this oxidization process, the metal or the resistive alloy has a component diffusing into the superconductor and thus changing its crystal structure. This disadvantageously results in the superconducting wire having a reduced critical current density. As such, while a high-resistance element is arranged to reduce ac loss, the method of producing the same and the material(s) for and type of the same can disadvantageously affect and thus reduce the critical current density of the superconducting wire, an essential property thereof. Thus, there is a need for a development of a material for the high-resistance element and of a method of producing the same which does not have an effect impairing superconducting properties of the superconducting wire including critical current density.

One object of the present invention therefore is to overcome such disadvantages as described above, and provide an oxide high-temperature superconducting wire having a structure with an oxide superconductor surrounded by a high-resistance element prevented from having an effect impairing on superconducting properties including critical current density, and a method of producing the same.

DISCLOSURE OF THE INVENTION

The present invention in one aspect provides an oxide high-temperature superconducting wire including an oxide superconductor, a sheath, a high-resistance element and a coating. The sheath is formed of a material containing silver and covers the oxide superconductor. The high-resistance element is formed of a strontium-vanadium oxide and coats the sheath. The coating is formed of a material containing silver and coats the high-resistance element.

In the oxide high-temperature superconducting wire in the above one aspect the high-resistance element, formed of a strontium-vanadium oxide and arranged to reduce ac loss, does not have a negative effect on the oxide superconductor or the sheath to impair superconducting properties. Thus, ac loss can be reduced and, as a result, critical current density can be improved.

The present invention in another aspect provides an oxide high-temperature superconducting wire including an oxide superconductor, a high-resistance element and a coating. The high-resistance element is formed of ceramic and coats the oxide superconductor. The coating is formed of a material containing silver and coats the high-resistance element. The ceramic is preferably formed of a strontium-vanadium oxide.

The present invention in still another aspect provides an oxide high-temperature superconducting wire including an oxide superconductor, a first high-resistance element, a sheath, a second high-resistance element and a coating. The first high-resistance element is formed of ceramic and coats the oxide superconductor. The sheath is formed of a material containing silver and covers the first high-resistance element. The second high-resistance element is formed of ceramic and coats the sheath. The coating is formed of a material containing silver and coats the second high-resistance element. The ceramic is preferably formed of a strontium-vanadium oxide.

In the oxide high-temperature superconducting wires in the above two aspects the high-resistance element and the first high-resistance element, formed of ceramic and arranged to reduce ac loss, do not have an effect for example impairing superconducting properties if they are brought into contact with a surface of the oxide superconductor. Thus the high-resistance element and the first and second high-resistance elements can provide their essential function of reducing ac loss and as a result improve critical current density.

The present oxide high-temperature superconducting wires in the above three aspects preferably include a plurality of sheaths, with the high-resistance element or the second high-resistance element interposed therebetween. Thus, ac loss can further be reduced.

Preferably the oxide superconductor is provided in the form of a filament.

Preferably the high-resistance element and the first and second high-resistance elements are formed of the strontium-vanadium oxide including at least one of $Sr_6V_2O_{11}$ and $SrV_2O_6$.

Preferably the sheath and the coating are formed of silver or silver alloy.

Preferably the oxide superconductor is a Bi(Pb)—Sr—Ca—Cu—O-based superconductor.

The present invention in one aspect provides a method of producing an oxide high-temperature superconducting wire including the three following methods:

Method I of Producing an Oxide High-temperature Superconducting Wire

This method includes the steps of:
(a) packing, in a first pipe formed of a material containing silver, source powder providing an oxide superconductor when the source powder is thermally treated or powder of the oxide superconductor;
(b) arranging in a second pipe formed of a material containing silver the first pipe having the source powder or the powder of the oxide superconductor packed therein;
(c) packing a powdery strontium-vanadium oxide between an outer circumferential surface of the first pipe and an inner circumferential surface of the second pipe; and
(d) subjecting to a plastic working and a thermal treatment the second pipe having the powdery strontium-vanadium oxide packed therein.

Method II of Producing an Oxide High-temperature Superconducting Wire

This method includes the steps of:
(a) packing, in a first pipe formed of a material containing silver, source powder providing an oxide superconductor when the source powder is thermally treated or powder of the oxide superconductor;
(b) preparing from a powdery strontium-vanadium oxide a green compact having a hole;
(c) inserting into the hole of the green compact the first pipe having the source powder or the powder of the oxide superconductor packed therein;
(d) arranging in a second pipe formed of a material containing silver the green compact having the first pipe inserted therein; and
(e) subjecting to a plastic working and a thermal treatment the second pipe having the green compact packed therein.

Method III of Producing an Oxide High-temperature Superconducting Wire

This method includes the steps of:
(a) packing, in a first pipe formed of a material containing silver, source powder providing an oxide superconductor when the source powder is thermally treated or powder of the oxide superconductor;
(b) applying on an outer circumferential surface of the first pipe having the source powder or the powder of the oxide superconductor packed therein a slurry prepared from a powdery strontium-vanadium oxide;
(c) arranging in a second pipe formed of a material containing silver the first pipe having the slurry applied thereon; and
(d) subjecting to a plastic working and a thermal treatment the second pipe having the first pipe arranged therein.

Furthermore the present invention in another aspect provides a method of producing an oxide high-temperature superconducting wire including the following method:

Method IV of Producing an Oxide High-temperature Superconducting Wire

This method includes the steps of:
(a) preparing a green compact in the form of a bar from source powder providing an oxide superconductor when the source powder is thermally treated or from powder of the oxide superconductor;
(b) applying on a surface of the green compact a slurry prepared from a powdery strontium-vanadium oxide;
(c) inserting into a first pipe formed of a material containing silver the green compact having the slurry applied thereon;
(d) arranging in a second pipe formed of a material containing silver the first pipe having the green compact inserted therein; and
(e) subjecting to a plastic working and a thermal treatment the second pipe having the first pipe arranged therein.

Furthermore the present invention in still another aspect provides a method of producing an oxide high-temperature superconducting wire including the following two methods:

Method V of Producing an Oxide High-temperature Superconducting Wire

This method includes the steps of:
(a) preparing a green compact in the form of a bar from source powder providing an oxide superconductor when the source powder is thermally treated or from powder of the oxide superconductor;
(b) applying on a surface of the green compact a slurry prepared from a powdery strontium-vanadium oxide;
(c) inserting into a first pipe formed of a material containing silver the green compact having the slurry applied thereon;
(d) applying on outer circumferential surface of the first pipe having the green compact inserted therein a slurry prepared from a powdery strontium-vanadium oxide;
(e) arranging in a second pipe formed of a material containing silver the first pipe having the slurry applied thereon; and
(f) subjecting to a plastic working and a thermal treatment the second pipe having the first pipe arranged therein.

Method VI of Producing an Oxide High-temperature Superconducting Wire

This method includes the steps of:
(a) applying on an inner circumferential surface of a first pipe formed of a material containing silver a slurry prepared from a powdery strontium-vanadium oxide;
(b) packing, in the first pipe having the slurry applied thereon, source powder providing an oxide superconductor when the source powder is thermally treated or powder of the oxide superconductor;
(c) applying on an outer circumferential surface of the first pipe having the source powder or the powder of the oxide superconductor packed therein a slurry prepared from a powdery strontium-vanadium oxide;
(d) arranging in a second pipe formed of a material containing silver the first pipe having the slurry applied thereon; and (e) subjecting to a plastic working and a thermal treatment the second pipe having the first pipe arranged therein.

In methods I–VI preferably the powdery strontium-vanadium oxide has a grain size of 1 $\mu$m to 10 $\mu$m.

In methods I–VI preferably the step of subjecting includes twisting the second pipe before compressing and thermally treating the second pipe.

Thus in the present invention a high-resistance element arranged to reduce ac loss can be formed of a strontium-vanadium oxide to effectively reduce ac loss without impairing superconducting properties including critical current density.

BEST MODES FOR CARRYING OUT THE INVENTION

Figure 1:
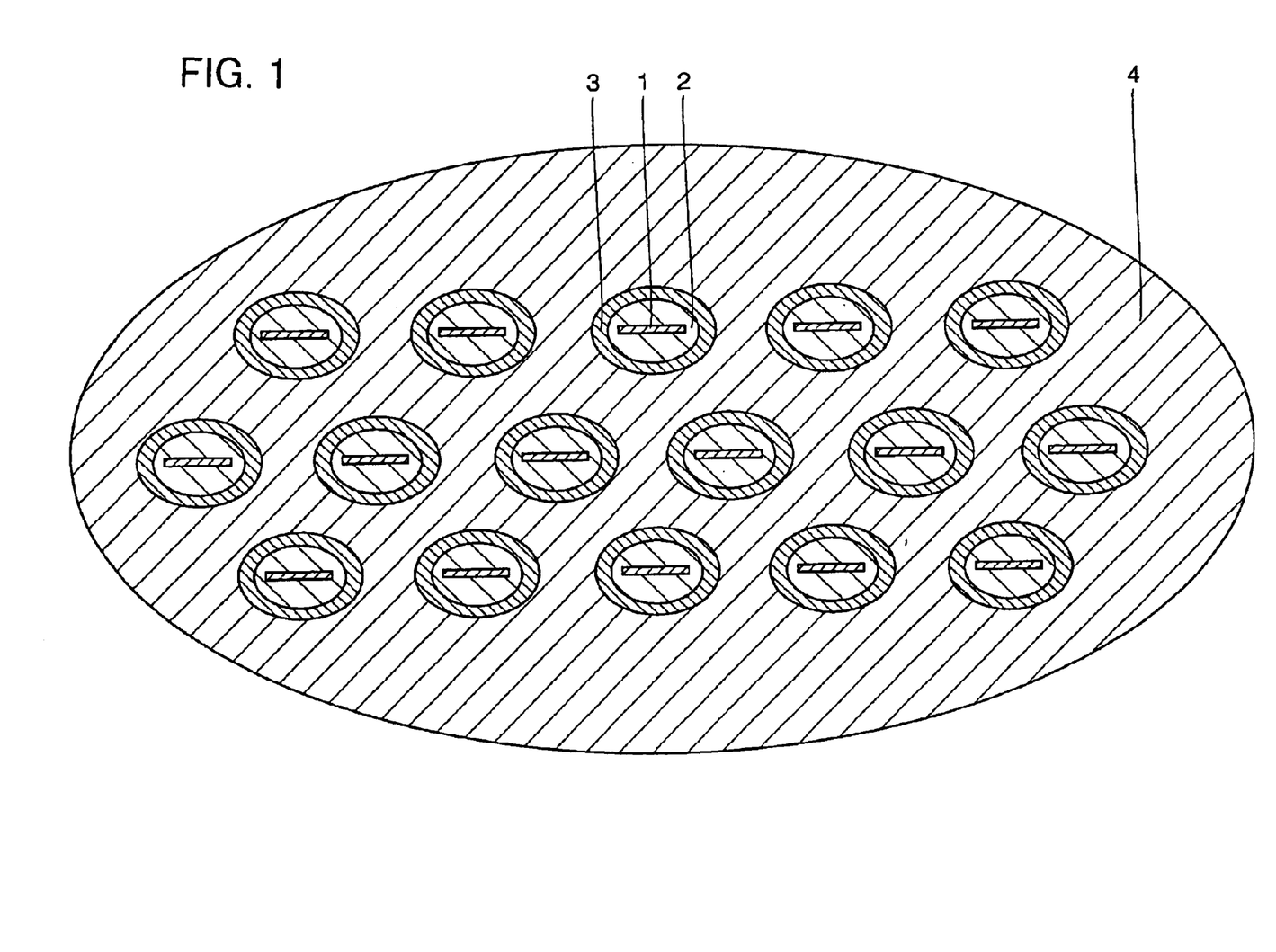
FIG. 1 schematically shows a lateral cross section of one embodiment of an oxide high-temperature superconducting wire in one aspect of the present invention.

FIG. 1 schematically shows a lateral cross section of one embodiment of an oxide high-temperature superconducting wire in one aspect of the present invention. As shown in FIG. 1, an oxide superconductor filament 1 formed of a Bi(Pb)—Sr—Ca—Cu—O-based superconductor is covered with a sheath 2 formed of silver. Sheath 2 is coated with a high-resistance element 3 formed of a strontium-vanadium oxide. A large number of sheathes 2 each coated with high-resistance element 3 are further coated by a coating 4 formed of silver.

Figure 2:
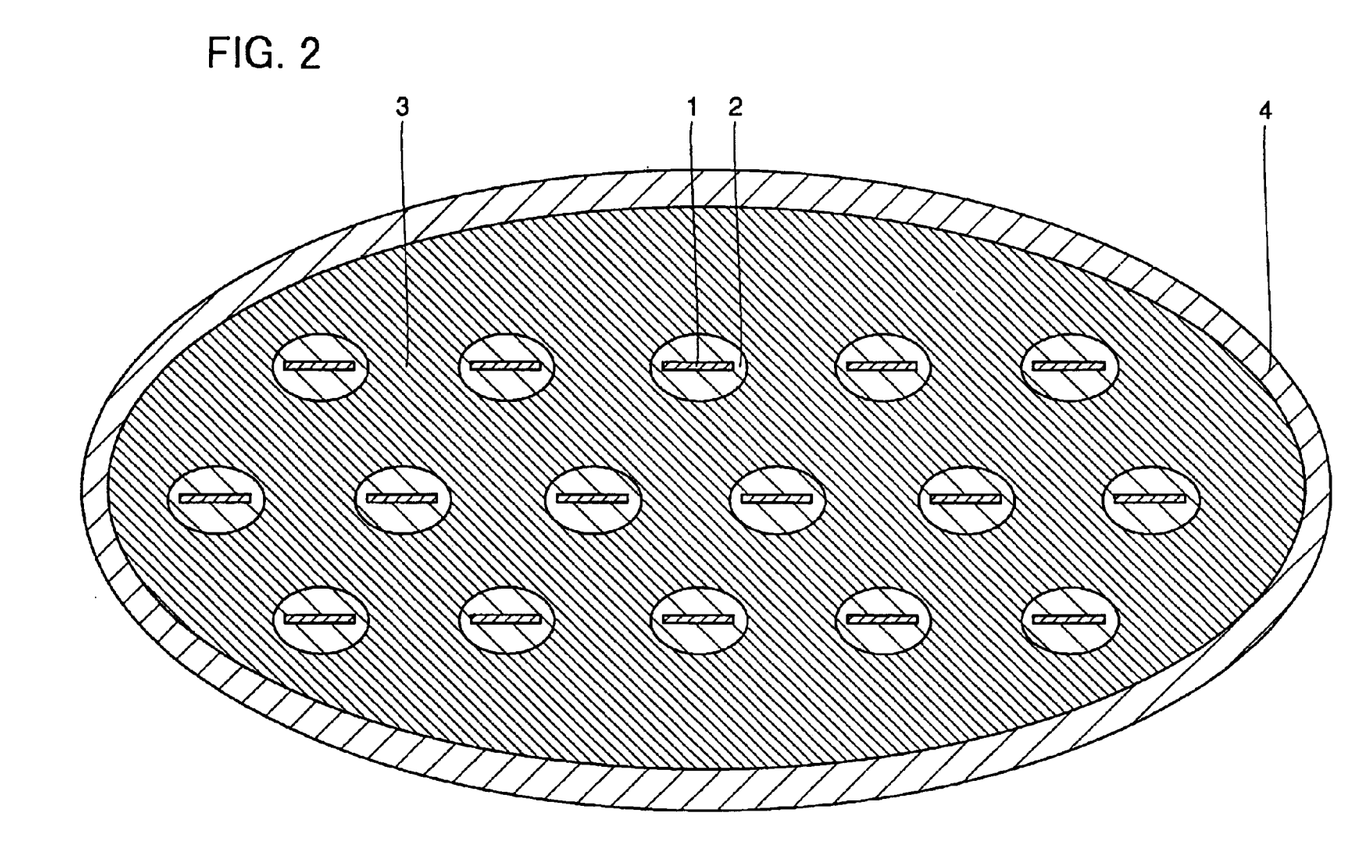
FIG. 2 schematically shows a lateral cross section of another embodiment of an oxide high-temperature superconducting wire in one aspect of the present invention.

FIG. 2 schematically shows a lateral cross section of another embodiment of an oxide high-temperature superconducting wire in one aspect of the present invention. As shown in FIG. 2, oxide superconductor filament 1 formed of a Bi(Pb)—Sr—Ca—Cu—O-based superconductor is covered by sheath 2 formed of silver. A large number of sheathes 2 are coated with high-resistance element 3 formed of a strontium-vanadium oxide. High-resistance element 3 is coated by coating 4 formed of silver.

Figure 3:
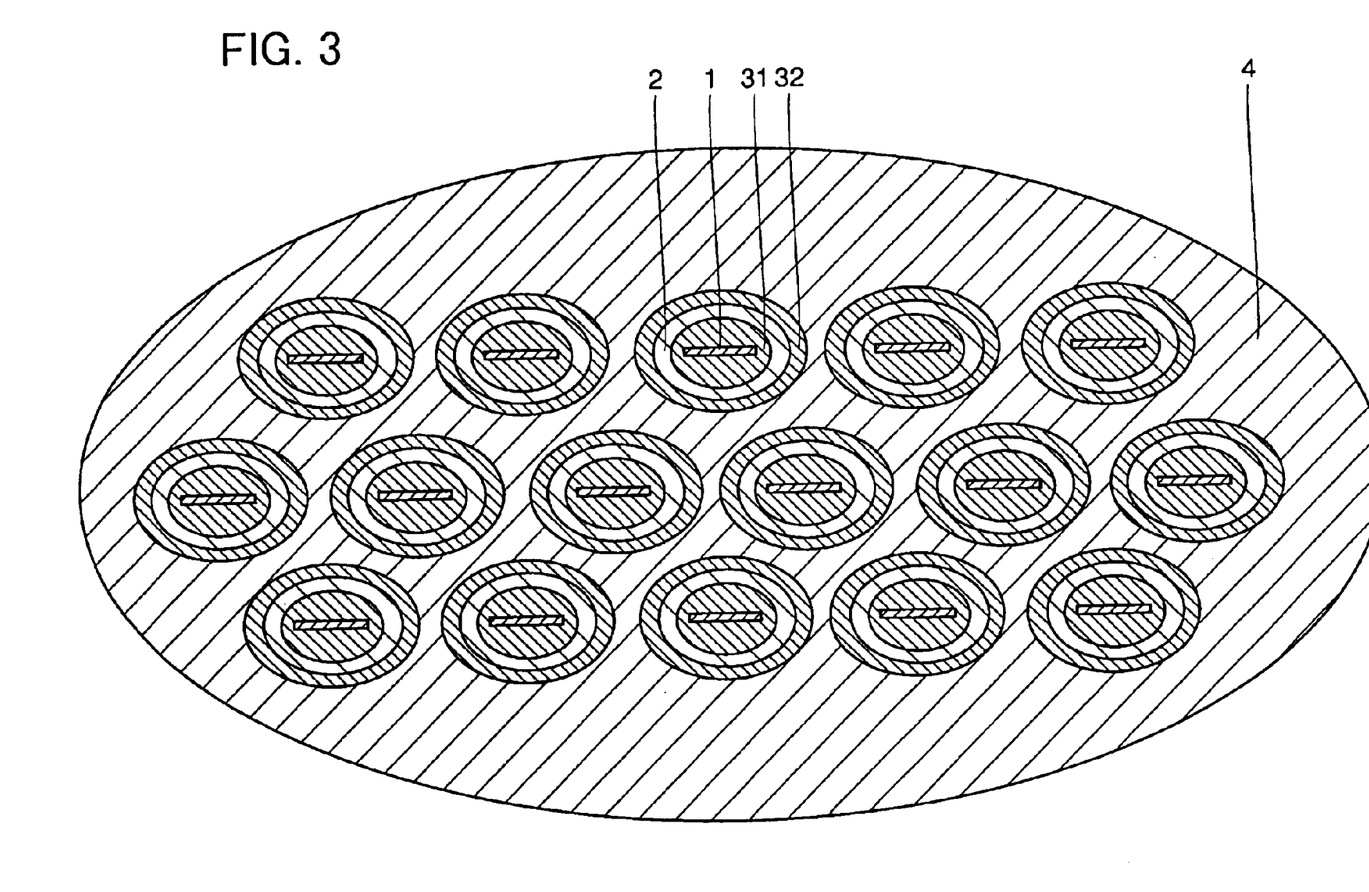
FIG. 3 schematically shows a lateral cross section of one embodiment of an oxide high-temperature superconducting wire in still another aspect of the present invention.

FIG. 3 schematically shows a lateral cross section of one embodiment of an oxide high-temperature superconducting wire in still another aspect of the present invention. As shown in FIG. 3, oxide superconductor filament 1 formed of a Bi(Pb)—Sr—Ca—Cu—O-based superconductor is coated by a first high-resistance element 31 formed of a strontium-vanadium oxide. The first high-resistance element 31 is covered by sheath 2 formed of silver. Sheath 2 is coated by a second high-resistance element 32 formed of a strontium-vanadium oxide. A large number of sheathes 2 each coated by the second high-resistance element 32 are coated by coating 4 formed of silver.

Figure 4:
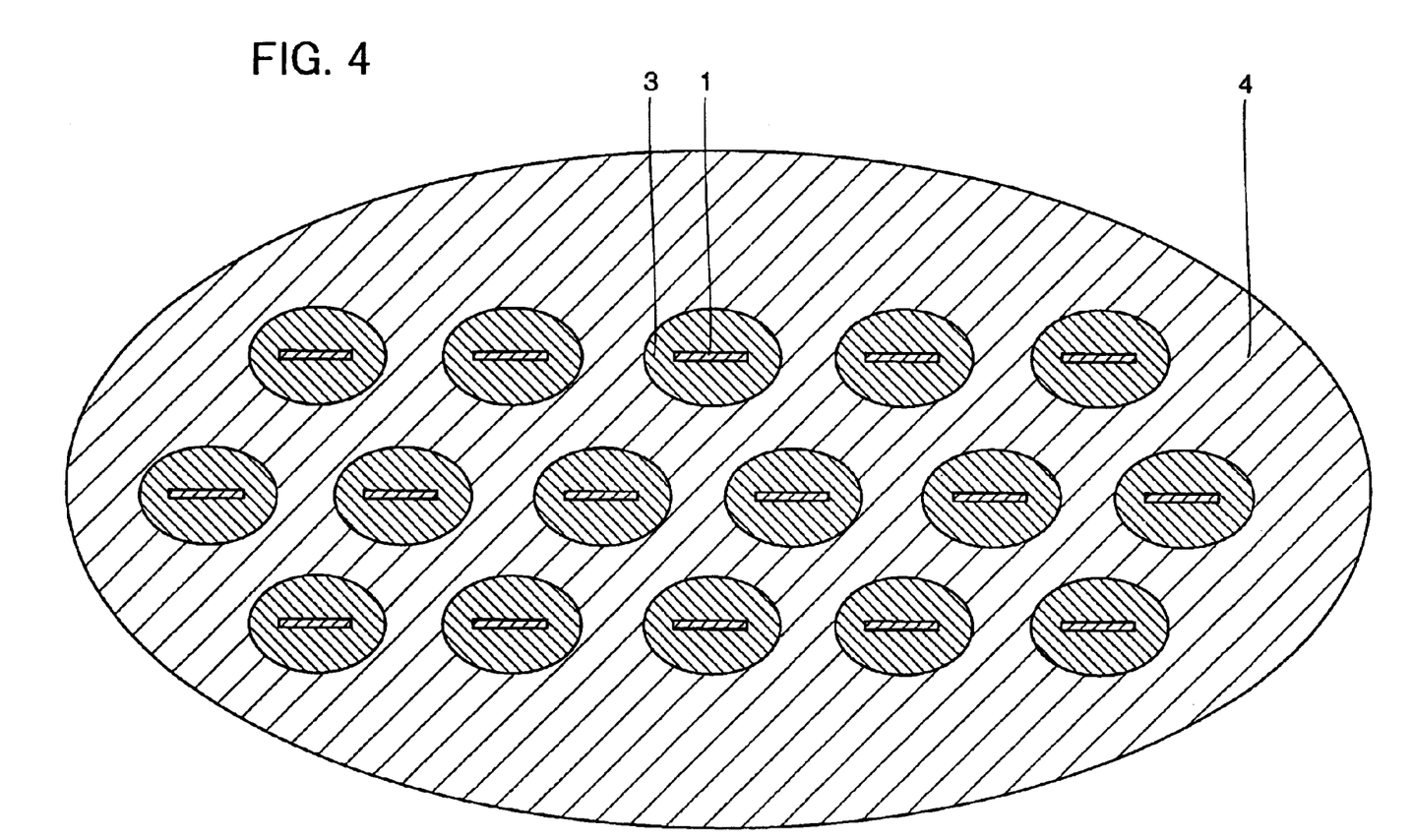
FIG. 4 schematically shows a lateral cross section of one embodiment of an oxide high-temperature superconducting wire in still another aspect of the present invention.

FIG. 4 schematically shows a lateral cross section of one embodiment of an oxide high-temperature superconducting wire in another aspect of the present invention. As shown in FIG. 4, oxide superconductor filament 1 formed of a Bi(Pb)—Sr—Ca—Cu—O-based superconductor is coated by high-resistance element 3 formed of a strontium-vanadium oxide. A large number of high-resistance elements 3 are coated by coating 4 formed of silver.

While in the above embodiments an oxide high-temperature superconducting wire has a flat, elliptical cross section, as seen laterally, it is not limited thereto and it may be provided in various forms, such as in a tape, as seen in lateral cross section.

First Example $Bi_2O_3$, PbO, $SrCO_3$, $CaCO_3$, and CuO were mixed together to prepare powder having a Bi:Pb:Sr:Ca:Cu constituent or atom ratio of 1.8:0.4: 2.0:2.0:3.0. The obtained powder was thermally treated at 700° C. for 12 hours and then crushed using a ball mill. The crushed powder was then thermally treated at 800° C. for 8 hours and then further crushed using a ball mill. The further crushed powder was then thermally treated at 850° C. for 4 hours and then crushed using a ball mill.

The powder thus obtained was processed, heated at 800° C. for 2 hours, and thus degassed and then packed in a silver pipe having an outer diameter of 25 mm$\phi$ and an inner diameter of 22 mm$\phi$ and serving as a first pipe. The silver pipe with the powder packed therein was drawn to have an outer diameter of 20 mm$\phi$. Together with a powdery oxide of $Sr_6V_2O_{11}$ having a grain size of 1.0 $\mu$m on average and serving as a material for a high-resistance element, the drawn wire was packed in a silver pipe having an outer diameter of 23 mm$\phi$ and an inner diameter of 22 mm$\phi$ and serving as a second pipe and they were drawn to allow the silver pipe to have an outer diameter of 1.44 mm$\phi$. The wire thus obtained was cut and thus divided into 61 wires, which were in turn bundled together and fit into a silver pipe having an outer diameter of 14 mm$\phi$ and an inner diameter of 13 mm$\phi$ and serving as a third pipe and they were drawn to have an outer diameter of 1.25 mm$\phi$. The obtained wire was rolled to have a thickness of 0.25 mm and thus formed in a tape.

For comparison, a process similar to the above process was employed to also produce a wire without the powdery oxide of $Sr_6V_2O_{11}$ packed therein and a wire with a powdery oxide of $SrV_2O_6$ packed therein rather than that of $Sr_6V_2O_{11}$.

The wire thus obtained was thermally treated at 845° C. for 50 hours and then cooled to room temperature. Then the wire was rolled to have a thickness of 0.22 mm and then thermally treated at 840° C. for 50 hours to provide an oxide high-temperature superconducting wire.

The obtained oxide high-temperature superconducting wire, having opposite ends with the $Sr_6V_2O_{11}$ or $SrV_2O_6$ oxide coating removed therefrom, was placed in liquid nitrogen and measured in a direct-current 4-terminal method for critical current density.

It has been revealed that the wire free of the oxide of $Sr_6V_2O_{11}$ had a critical current density of 20,000×10$^4$ A/m$^2$, whereas that containing the oxide of $Sr_6V_2O_{11}$ had a critical current density of 24,000×10$^4$ A/m$^2$ and that containing the oxide of $SrV_2O_6$ had a critical current density of 22,000×10$^4$ A/m$^2$.

FIG. 1 schematically shows a lateral cross section of the oxide high-temperature superconducting wire containing the oxide of $Sr_6V_2O_{11}$ or $SrV_2O_6$.

Second Example $Bi_2O_3$, PbO, $SrCO_3$, $CaCO_3$, and CuO were mixed together to prepare powder having a Bi:Pb:Sr:Ca:Cu constituent or atom ratio of 1.8:0.4: 2.0:2.0:3.0. The obtained powder was thermally treated at 700° C. for 12 hours and then crushed using a ball mill. The crushed powder was then thermally treated at 800° C. for 8 hours and then further crushed using a ball mill. The further crushed powder was then thermally treated at 850° C. for 4 hours and then crushed using a ball mill.

The powder thus obtained was processed, heated at 800° C. for 2 hours, and thus degassed and then packed in a silver pipe having an outer diameter of 25 mm$\phi$ and an inner diameter of 22 mm$\phi$ and serving as a first pipe. The silver pipe with the powder packed therein was drawn to have an outer diameter of 1.30 mm$\phi$ to provide a wire. The wire thus obtained was cut and thus divided into 61 wires.

Furthermore, a powdery oxide of $Sr_6V_2O_{11}$ having a grain size of 3.0 $\mu$m on average was used to prepare a columnar green compact having an outer diameter of 12.9 mm$\phi$. The columnar green compact was then provided with 61 holes having an inner diameter of 1.30 mm$\phi$.

Into the holes were respectively inserted the 61 wires obtained in the above process. The green compact with the wires inserted therein was inserted in a silver pipe having an outer diameter of 14 mm$\phi$ and an inner diameter of 13 mm$\phi$ and serving as a second pipe and they were drawn to allow the silver pipe to have an outer diameter of 1.25 mm$\phi$. Furthermore the silver pipe was rolled to have a thickness of 0.25 mm and thus formed in a tape.

The wire in the form of the tape was thermally treated at 845° C. for 50 hours and then cooled to room temperature. Then the wire was rolled to have a thickness of 0.22 mm and then thermally treated at 840° C. for 50 hours to provide an oxide high-temperature superconducting wire.

FIG. 2 schematically shows a lateral cross section of the oxide high-temperature superconducting wire thus obtained.

The obtained wire, having opposite ends with the $Sr_6V_2O_{11}$ oxide coating removed therefrom, was placed in liquid nitrogen and measured in the direct-current 4-terminal method for critical current density. It had a critical current density of $25,000 \times 10^4$ A/m$^2$.

Third Example $Bi_2O_3$, PbO, $SrCO_3$, $CaCO_3$, and CuO were mixed together to prepare powder having a Bi:Pb:Sr:Ca:Cu constituent or atom ratio of 1.8:0.4: 2.0:2.0:3.0. The obtained powder was thermally treated at 700° C. for 12 hours and then crushed using a ball mill. The crushed powder was then thermally treated at 800° C. for 8 hours and then further crushed using a ball mill. The further crushed powder was then thermally treated at 850° C. for 4 hours and then crushed using a ball mill.

The powder thus obtained was processed, heated at 800° C. for 2 hours, and thus degassed and then packed in a silver pipe having an outer diameter of 25 mm$\phi$ and an inner diameter of 22 mm$\phi$ and serving as a first pipe. The silver pipe with the powder packed therein was drawn to have an outer diameter of 1.30 mm$\phi$.

Furthermore, a powdery oxide of $Sr_6V_2O_{11}$ having a grain size of 5.0 $\mu$m on average and an organic binder were mixed together to prepare a slurry. The obtained slurry was used to coat in a thickness of 100 $\mu$m the wire obtained as described above. The coated wire then had the binder removed therefrom. The wire was then cut into 61 wires, which were in turn bundled together and fit into a silver pipe having an outer diameter of 14 mm$\phi$ and an inner diameter of 13 mm$\phi$ and serving as a second pipe and they were drawn to have an outer diameter of 1.25 mm$\phi$. The obtained wire was rolled to have a thickness of 0.25 mm and thus formed in a tape.

The wire in the form of the tape was thermally treated at 845° C. for 50 hours and then cooled to room temperature. Then the wire in the tape was rolled to have a thickness of 0.22 mm and then thermally treated at 840° C. for 200 hours to provide an oxide high-temperature superconducting wire.

FIG. 1 schematically shows a lateral cross section of the oxide high-temperature superconducting wire thus obtained.

The obtained wire, having opposite ends with the $Sr_{V2}O_{11}$ oxide coating removed therefrom, was placed in liquid nitrogen and measured in the direct-current 4-terminal method for critical current density. It had a critical current density of $23,000 \times 10^4$ A/m$^2$.

Fourth Example $Bi_2O_3$, PbO, $SrCO_3$, $CaCO_3$, and CuO were mixed together to prepare powder having a Bi:Pb:Sr:Ca:Cu constituent or atom ratio of 1.8:0.4: 2.0:2.0:3.0. The obtained powder was thermally treated at 700° C. for 12 hours and then crushed using a ball mill. The crushed powder was then thermally treated at 800° C. for 8 hours and then further crushed using a ball mill. The further crushed powder was then thermally treated at 850° C. for 4 hours and then crushed using a ball mill.

The powder thus obtained was processed, heated at 800° C. for 2 hours, and thus degassed and then hydrostatically pressed to prepare a green compact in the form of a bar having an outer diameter of 21 mm$\phi$.

Furthermore, a powdery oxide of $Sr_6V_2O_{11}$ having a grain size of several $\mu$m on average and an organic binder were mixed together to prepare a slurry. The obtained slurry was used to coat in a thickness of 200 $\mu$m a surface of the green compact formed into the bar as described above and it also had the binder removed. The coated green compact in the bar was then inserted into a silver pipe having an outer diameter of 25 mm$\phi$ and an inner diameter of 22 mm$\phi$ and serving as a first pipe. The silver pipe with the green compact inserted therein was drawn to have an outer diameter of 1.30 mm$\phi$. The wire then had a surface coated with the slurry in a thickness of 100 $\mu$m and the coated wire also had the binder removed therefrom. The wire thus obtained was then cut into 61 wires.

The 61 wires were then bundled together and fit into a silver pipe having an outer diameter of 14 mm$\phi$ and an inner diameter of 13 mm$\phi$ and serving as a second pipe and they were drawn to have an outer diameter of 1.25 mm$\phi$. The obtained wire was rolled to have a thickness of 0.25 mm and thus formed in a tape.

The wire in the tape was thermally treated at 845° C. for 50 hours and then cooled to room temperature. Then the wire in the tape was rolled to have a thickness of 0.21 mm and then thermally treated at 840° C. for 150 hours to provide an oxide high-temperature superconducting wire.

FIG. 3 schematically shows a lateral cross section of the oxide high-temperature superconducting wire thus obtained.

The obtained wire, having opposite ends with the $Sr_6V_2O_{11}$ oxide coating removed therefrom, was placed in liquid nitrogen and measured in the direct-current 4-terminal method for critical current density. It had a critical current density of $30,000 \times 10^4$ A/m$^2$.

Fifth Example $Bi_2O_3$, PbO, $SrCO_3$, $CaCO_3$, and CuO were mixed together to prepare powder having a Bi:Pb:Sr:Ca:Cu constituent or atom ratio of 1.8:0.4: 2.0:2.0:3.0. The obtained powder was thermally treated at 700° C. for 12 hours and then crushed using a ball mill. The crushed powder was then thermally treated at 800° C. for 8 hours and then further crushed using a ball mill. The further crushed powder was then thermally treated at 850° C. for 4 hours and then crushed using a ball mill.

The powder thus obtained was processed, heated at 800° C. for 2 hours, and thus degassed.

Furthermore, a powdery oxide of $SrV_2O_6$ having a grain size of 1 μm to 10 μm on average and an organic binder were mixed together to prepare a slurry. The obtained slurry was used to coat in a thickness of 200 μm an internal surface of a silver pipe having an outer diameter of 25 mmφ and an inner diameter of 22 mmφ and it also had the binder removed. The pipe thus processed, corresponding to a first pipe, received the powder obtained as described above and the silver pipe with the powder packed therein was drawn to have an outer diameter of 1.30 mmφ. The wire then had a surface coated with the slurry in a thickness of 100 μm and the coated wire also had the binder removed therefrom. The wire thus obtained was then cut into 61 wires.

The 61 wires were then bundled together and fit into a silver pipe having an outer diameter of 14 mmφ and an inner diameter of 13 mmφ and serving as a second pipe and they were drawn to have an outer diameter of 1.25 mm+. The obtained wire was rolled to have a thickness of 0.25 mm and thus formed in a tape.

The wire in the tape was thermally treated at 845° C. for 50 hours and then cooled to room temperature. Then the wire in the tape was rolled to have a thickness of 0.21 mm and then thermally treated at 840° C. for 150 hours to provide an oxide high-temperature superconducting wire.

FIG. 3 schematically shows a lateral cross section of the oxide high-temperature superconducting wire thus obtained.

The obtained wire, having opposite ends with the $SrV_2O_6$ oxide coating removed therefrom, was placed in liquid nitrogen and measured in the direct-current 4-terminal method for critical current density. It had a critical current density of $27,000\times10^4$ A/m².

Sixth Embodiment $Bi_2O_3$, PbO, $SrCO_3$, $CaCO_3$, and CuO were mixed together to prepare powder having a Bi:Pb:Sr:Ca:Cu constituent or atom ratio of 1.8:0.4: 2.0:2.0:3.0. The obtained powder was thermally treated at 700° C. for 12 hours and then crushed using a ball mill. The crushed powder was then thermally treated at 800° C. for 8 hours and then further crushed using a ball mill. The further crushed powder was then thermally treated at 850° C. for 4 hours and then crushed using a ball mill.

The powder thus obtained was processed, heated at 800° C. for 2 hours, and thus degassed and then hydrostatically pressed to prepare a green compact in the form of a bar having an outer diameter of 21 mmφ.

Furthermore, a powdery oxide of $Sr_6V_2O_{11}$ having a grain size of several μm on average and an organic binder were mixed together to prepare a slurry. The obtained slurry was used to coat in a thickness of 200 μm a surface of the green compact formed into the bar as described above and it also had the binder removed. The coated green compact in the bar was then inserted into a silver pipe having an outer diameter of 25 mmφ and an inner diameter of 22 mmφ and serving as a first pipe. The silver pipe with the green compact inserted therein was drawn to have an outer diameter of 1.44 mmφ. The wire thus obtained was then cut into 61 wires.

The 61 wires were then bundled together and fit into a silver pipe having an outer diameter of 14 mmφ and an inner diameter of 13 mmφ and serving as a second pipe and they were drawn to have an outer diameter of 1.25 mmφ. The obtained wire was rolled to have a thickness of 0.25 mm and thus formed in a tape.

The wire in the tape was thermally treated at 845° C. for 50 hours and then cooled to room temperature. Then the wire in the tape was rolled to have a thickness of 0.21 mm and then thermally treated at 840° C. for 150 hours to provide an oxide high-temperature superconducting wire.

FIG. 4 schematically shows a lateral cross section of the oxide high-temperature superconducting wire thus obtained.

The obtained wire, having opposite ends with the $Sr_6V_2O_{11}$ oxide coating removed therefrom, was placed in liquid nitrogen and measured in the direct-current 4-terminal method for critical current density. It had a critical current density of $28,000\times10^4$ A/m².

Seventh Example $Bi_2O_3$, PbO, $SrCO_3$, $CaCO_3$, and CuO were mixed together to prepare powder having a Bi:Pb:Sr:Ca:Cu constituent or atom ratio of 1.8:0.4: 2.0:2.0:3.0. The obtained powder was thermally treated at 700° C. for 12 hours and then crushed using a ball mill. The crushed powder was then thermally treated at 800° C. for 8 hours and then further crushed using a ball mill. The further crushed powder was then thermally treated at 850° C. for 4 hours and then crushed using a ball mill.

The powder thus obtained was processed, heated at 800° C. for 2 hours , and thus degassed and then packed into a silver pipe having an outer diameter of 25 mmφ and an inner diameter of 22 mmφ and serving as a first pipe. The silver pipe with the powder packed therein was drawn to have an outer diameter of 20 mmφ. Then, together with a powdery oxide of $Sr_6V_2O_{11}$ having a grain size of 1–10 μm on average, the drawn wire was packed in a silver pipe having an outer diameter of 23 mmφ and an inner diameter of 22 mmφ and serving as a second pipe and they were drawn to allow the silver pipe to have an outer diameter of 1.44 mmφ. The wire thus obtained was then cut into 61 wires.

The 61 wires were then bundled together and fit into a silver pipe having an outer diameter of 14 mmφ and an inner diameter of 13 mmφ and serving as a third pipe and they were drawn to have an outer diameter of 1.25 mmφ.

Furthermore the obtained wire was twisted at a pitch of 10 mm and also rolled to be 25 mm thick and thus formed in a tape.

The wire in the tape was thermally treated at 845° C. for 50 hours and then cooled to room temperature. Then the wire in the tape was rolled to have a thickness of 0.22 mm and then thermally treated at 840° C. for 100 hours to provide an oxide high-temperature superconducting wire.

FIG. 1 schematically shows a lateral cross section of the oxide high-temperature superconducting wire thus obtained.

The obtained wire was placed in liquid nitrogen and measured for ac loss. Furthermore, the same wire having opposite ends with the $Sr_6V_2O_{11}$ oxide coating removed therefrom was also placed in liquid nitrogen and measured in the direct-current 4-terminal method for critical current density.

It has been revealed that a wire free of the oxide of $Sr_6V_2O_{11}$ and simply covered by a silver sheath, as conventional, had a critical current density of $21,000 \times 10^4$ A/m², whereas the wire obtained as described above had a critical current density of $23,000 \times 10^4$ A/m² and an ac loss corresponding to 1/10 of that of the conventional wire simply covered with a silver sheath.

Although the present invention has been described and illustrated in detail, it is clearly understood that the same is by way of illustration and example only and is not to be taken by way of limitation, the spirit and scope of the present invention being limited only by the terms of the appended claims.

Industrial Applicability

The present oxide high-temperature superconducting wire is used in the field of electrical power, transportation, high energy and medical field, and the like.

What is claimed is:

1. An oxide high-temperature superconducting wire comprising:
    an oxide superconductor,
    a sheath formed of a material containing silver, and covering said oxide superconductor;
    a high-resistance element formed of a strontium-vanadium oxide and coating said sheath; and
    a coating formed of a material containing silver, and coating said high-resistance element.

2. The oxide high-temperature superconducting wire of claim 1, comprising a plurality of said sheaths with said high-resistance element interposed therebetween.

3. The oxide high-temperature superconducting wire of claim 1, wherein said oxide superconductor is provided in a from of a filament.

4. The oxide high-temperature superconducting wire of claim 1, wherein said strontium-vanadium oxide includes at least one selected from the group consisting of $Sr_6V_2O_{11}$ and $SrV_2O_6$.

5. The oxide high-temperature superconducting wire of claim 1, wherein said sheath and said coating are formed of silver or silver alloy.

6. The oxide high-temperature superconducting wire of claim 1, wherein said oxide superconductor is a Bi(Pb)—Sr—Ca—Cu—O-based superconductor.

7. An oxide high-temperature superconducting wire comprising:
    an oxide superconductor;
    a high-resistance element formed of ceramic and coating said oxide superconductor; and
    a coating formed of a material containing silver, and coating said high-resistance element,
    wherein the said ceramic is formed of a strontium-vanadium oxide.

8. The oxide high-temperature superconducting wire of claim 7, wherein said oxide superconductor is provided in a from of a filament.

9. The oxide high-temperature superconducting wire of claim 7, wherein said strontium-vanadium oxide includes at least one selected from the group consisting of $Sr_6V_2O_{11}$ and $SrV_2O_6$.

10. The oxide high-temperature superconducting wire of claim 7, wherein said oxide superconductor is a Bi(Pb)—Sr—Ca—Cu—O-based superconductor.

11. An oxide high-temperature superconducting wire comprising:
    an oxide superconductor;
    a first high-resistance element formed of ceramic and coating said oxide superconductor;
    a sheath formed of a material containing silver, and covering said first high-resistance element;
    a second high-resistance element formed of ceramic and coating said sheath (2); and
    a coating formed of a material containing silver, and coating said second high-resistance element,
    wherein the said ceramic is formed of a strontium-vanadium oxide.

12. The oxide high-temperature superconducting wire of claim 11, comprising a plurality of said sheaths with said second high-resistance element (32) interposed therebetween.

13. The oxide high-temperature superconducting wire of claim 11, wherein said oxide superconductor is provided in a from of a filament.

14. The oxide high-temperature superconducting wire of claim 11, wherein said strontium-vanadium oxide includes at least one selected from the group consisting of $Sr_6V_2O_{11}$ and $SrV_2O_6$.

15. The oxide high-temperature superconducting wire of claim 11, wherein said sheath and said coating are formed of silver or silver alloy.

16. The oxide high-temperature superconducting wire of claim 11, wherein said oxide superconductor is a Bi(Pb)—Sr—Ca—Cu—O-based superconductor.

17. A method of producing an oxide high-temperature superconducting wire, comprising the steps of:
    packing, in a first pipe formed of a material containing silver, source powder providing an oxide superconductor when said source powder is thermally treated or powder of said oxide superconductor;
    arranging in a second pipe formed of a material containing silver said first pipe having said source powder or said powder of said oxide superconductor packed therein;
    packing a powdery strontium-vanadium oxide between an outer circumferential surface of said first pipe and an inner circumferential surface of said second pipe; and
    subjecting to a plastic working and a thermal treatment said second pipe having said powdery strontium-vanadium oxide packed therein.

18. The method of claim 17, wherein said powdery strontium-vanadium oxide has a grain size of 1 μm to 10 μm.

19. The method of claim 17, wherein the step of subjecting includes twisting said second pipe before compressing and thermally treating said second pipe.

20. A method of producing an oxide high-temperature superconducting wire, comprising the steps of:
    packing, in a first pipe formed of a material containing silver, source powder providing an oxide superconductor when said source powder is thermally treated or powder of said oxide superconductor;
    preparing from a powdery strontium-vanadium oxide a green compact having a hole;
    inserting into said hole of said green compact said first pipe having said source powder or said powder of said oxide superconductor packed therein;
    arranging in a second pipe formed of a material containing silver said green compact having said first pipe inserted therein; and
    subjecting to a plastic working and a thermal treatment said second pipe having said green compact packed therein.

21. The method of claim 20, wherein said powdery strontium-vanadium oxide has a grain size of 1 μm to 10 μm.

22. The method of claim 20, wherein the step of subjecting includes twisting said second pipe before compressing and thermally treating said second pipe.

23. A method of producing an oxide high-temperature superconducting wire, comprising the steps of:
packing, in a first pipe formed of a material containing silver, source powder providing an oxide superconductor when said source powder is thermally treated or powder of said oxide superconductor;
applying on an outer circumferential surface of said first pipe having said source powder or said powder of said oxide superconductor packed therein a slurry prepared from a powdery strontium-vanadium oxide;
arranging in a second pipe formed of a material containing silver said first pipe having said slurry applied thereon; and
subjecting to a plastic working and a thermal treatment said second pipe having said first pipe arranged therein.

24. The method of claim 23, wherein said powdery strontium-vanadium oxide has a grain size of 1 μm to 10 μm.

25. The method of claim 23, wherein the step of subjecting includes twisting said second pipe before compressing and thermally treating said second pipe.

26. A method of producing an oxide high-temperature superconducting wire, comprising the steps of:
preparing a green compact in a form of a bar from source powder providing an oxide superconductor when said source powder is thermally treated or from powder of said oxide superconductor;
applying on a surface of said green compact a slurry prepared from a powdery strontium-vanadium oxide;
inserting into a first pipe formed of a material containing silver said green compact having said slurry applied thereon;
arranging in a second pipe formed of a material containing silver said first pipe having said green compact inserted therein; and
subjecting to a plastic working and a thermal treatment said second pipe having said first pipe arranged therein.

27. The method of claim 26, wherein said powdery strontium-vanadium oxide has a grain size of 1 μm to 10 μm.

28. The method of claim 26, wherein the step of subjecting includes twisting said second pipe before compressing and thermally treating said second pipe.

29. A method of producing an oxide high-temperature superconducting wire, comprising the steps of:
preparing a green compact in a form of a bar from source powder providing an oxide superconductor when said source powder is thermally treated or from powder of said oxide superconductor;
applying on a surface of said green compact a slurry prepared from a powdery strontium-vanadium oxide;
inserting into a first pipe formed of a material containing silver said green compact having said slurry applied thereon;
applying on outer circumferential surface of said first pipe having said green compact inserted therein a slurry prepared from a powdery strontium-vanadium oxide;
arranging in a second pipe formed of a material containing silver said first pipe having said slurry applied thereon; and
subjecting to a plastic working and a thermal treatment said second pipe having said first pipe arranged therein.

30. The method of claim 29, wherein said powdery strontium-vanadium oxide has a grain size of 1 μm to 10 μm.

31. The method of claim 29, wherein the step of subjecting includes twisting said second pipe before compressing and thermally treating said second pipe.

32. A method of producing an oxide high-temperature superconducting wire, comprising the steps of:
applying on an inner circumferential surface of a first pipe formed of a material containing silver a slurry prepared from a powdery strontium-vanadium oxide;
packing, in said first pipe having said slurry applied thereon, source powder providing an oxide superconductor when said source powder is thermally treated or powder of said oxide superconductor;
applying on an outer circumferential surface of said first pipe having said source powder or said powder of said oxide superconductor packed therein a slurry prepared from a powdery strontium-vanadium oxide;
arranging in a second pipe formed of a material containing silver said first pipe having said slurry applied thereon; and
subjecting to a plastic working and a thermal treatment said second pipe having said first pipe arranged therein.

33. The method of claim 32, wherein said powdery strontium-vanadium oxide has a grain size of 1 μm to 10 μm.

34. The method of claim 32, wherein the step of subjecting includes twisting said second pipe before compressing and thermally treating said second pipe.

35. An oxide high-temperature superconducting wire comprising:
an oxide superconductor;
a high-resistance element formed of strontium-vanadium oxide and covering said oxide superconductor; and
a coating formed of a silver-containing material and covering said high-resistance element.

* * * * *